(12) United States Patent
Verma et al.

(10) Patent No.: US 11,443,088 B1
(45) Date of Patent: Sep. 13, 2022

(54) SIMULATION USING ACCELERATED MODELS

(71) Applicant: Xilinx, Inc., San Jose, CA (US)

(72) Inventors: Gaurav Kumar Verma, Fremont, CA (US); Saikat Bandyopadhyay, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 275 days.

(21) Appl. No.: 16/897,899

(22) Filed: Jun. 10, 2020

(51) Int. Cl.
| | |
|---|---|
| *G06F 11/26* | (2006.01) |
| *G06F 9/44* | (2018.01) |
| *G06F 30/331* | (2020.01) |
| *G06F 16/901* | (2019.01) |
| *G06F 9/30* | (2018.01) |
| *G06F 9/46* | (2006.01) |
| *G06F 16/22* | (2019.01) |
| *G06F 16/955* | (2019.01) |
| *G06F 16/23* | (2019.01) |

(Continued)

(52) U.S. Cl.
CPC ........ *G06F 30/331* (2020.01); *G06F 9/30036* (2013.01); *G06F 9/463* (2013.01); *G06F 16/9017* (2019.01); *G06F 9/44* (2013.01); *G06F 9/4406* (2013.01); *G06F 9/547* (2013.01); *G06F 16/22* (2019.01); *G06F 16/23* (2019.01); *G06F 16/2379* (2019.01); *G06F 16/285* (2019.01); *G06F 16/951* (2019.01); *G06F 16/955* (2019.01); *G06F 16/9535* (2019.01)

(58) Field of Classification Search
CPC .. G06F 30/331; G06F 16/9017; G06F 16/285; G06F 16/951; G06F 16/22; G06F 16/23; G06F 16/2379; G06F 16/955; G06F 16/9535; G06F 9/30036; G06F 9/463; G06F 9/547; G06F 9/4406; G06F 9/44
See application file for complete search history.

(56) References Cited

U.S. PATENT DOCUMENTS

| | | | |
|---|---|---|---|
| 7,197,445 | B1 | 3/2007 | Deepak et al. |
| 7,302,377 | B1 | 11/2007 | Deepak |

(Continued)

OTHER PUBLICATIONS

Kaiyuan Guo et al., Software-Hardware Codesign for Efficient Neural Network Acceleration, May 10, 2017, [Retrieved on Apr. 25, 2022]. Retrieved from the internet: <URL: https://ieeexplore.ieee.org/stamp/stamp.jsp?tp=&arnumber=7924276> 8 Pages (18-25) (Year: 2017).*

(Continued)

*Primary Examiner* — Anibal Rivera
(74) *Attorney, Agent, or Firm* — Kevin T. Cuenot

(57) ABSTRACT

Simulation of a circuit design using accelerated models can include determining, using computer hardware, that a design unit of a circuit design specified in a hardware description language is a prime block and determining, using the computer hardware, an output vector corresponding to an output of the prime block. Using the computer hardware, contents of the prime block can be replaced with an accelerated simulation model specified in a high level language, wherein the accelerated simulation model can determine a value for the output of the prime block as a function of values of one or more inputs of the prime block using the output vector. Using the computer hardware, the circuit design can be elaborated and compiled into object code that is executable to simulate the circuit design.

18 Claims, 4 Drawing Sheets

(51) Int. Cl.
    *G06F 16/9535* (2019.01)
    *G06F 16/951* (2019.01)
    *G06F 9/4401* (2018.01)
    *G06F 16/28* (2019.01)
    *G06F 9/54* (2006.01)

(56) References Cited

U.S. PATENT DOCUMENTS

| | | | |
|---|---|---|---|
| 7,330,808 B1 | 2/2008 | Jorgensen et al. |
| 7,451,417 B1 | 11/2008 | Campbell et al. |
| 7,590,137 B1 | 9/2009 | Chan et al. |
| 7,636,653 B1 | 12/2009 | Chan et al. |
| 7,673,201 B1 | 3/2010 | Chan et al. |
| 7,707,019 B1 | 4/2010 | Ballagh et al. |
| 7,721,090 B1 | 5/2010 | Deepak et al. |
| 7,739,092 B1 | 6/2010 | Ballagh et al. |
| 7,895,026 B1 | 2/2011 | Kelly et al. |
| 7,930,162 B1 | 4/2011 | Chan et al. |
| 8,041,553 B1 | 10/2011 | Hernandez et al. |
| 8,074,077 B1 | 12/2011 | Neema et al. |
| 8,150,638 B1 | 4/2012 | Wu et al. |
| 8,195,441 B1 | 6/2012 | Ou et al. |
| 8,352,229 B1 | 1/2013 | Ma et al. |
| 8,413,088 B1 * | 4/2013 | Armbruster ......... G06F 30/3323 716/101 |
| 8,620,638 B1 * | 12/2013 | Chan ................... G06F 30/33 703/13 |
| 9,117,043 B1 | 8/2015 | Huang et al. |
| 10,296,673 B1 | 5/2019 | Ghosh et al. |
| 10,437,946 B1 | 10/2019 | Kasat et al. |
| 10,437,949 B1 | 10/2019 | Mihalache et al. |
| 10,671,785 B1 | 6/2020 | Mihalache et al. |
| 2011/0307233 A1 * | 12/2011 | Tseng .................. G06F 30/33 703/21 |

OTHER PUBLICATIONS

Srihari Cadambi et al., A Fast, Inexpensive and Scalable Hardware Acceleration Technique for Functional Simulation, Jun. 10-14, 2002, [Retrieved on Apr. 25, 2022]. Retrieved from the internet: <URL: https://dl.acm.org/doi/pdf/10.1145/513918.514062> 6 Pages (570-575) (Year: 2002).*

* cited by examiner

US 11,443,088 B1

SIMULATION USING ACCELERATED MODELS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to computer-based simulation of circuit designs and, more particularly, to functional simulation.

BACKGROUND

Designers have come to rely on computer-based simulation throughout the development process for circuit designs. Computer-based simulation provides designers with the ability to test and/or verify different aspects of a circuit design without having to implement the circuit design in an integrated circuit (IC) or other physical form. Using simulation, designers are able to verify the state of particular signals throughout the circuit design including within particular design units of the circuit design. Despite these benefits, simulation of circuit designs remains relatively slow compared to the speed at which the circuit design operates when implemented in an actual IC. In addition, simulating a circuit design typically requires a large amount of computational resources, e.g., processor execution time and/or runtime memory. These limitations can diminish the usefulness of simulation and may also limit the size of circuit design that may be simulated.

SUMMARY

In one aspect, a method can include determining, using computer hardware, that a design unit of a circuit design specified in a hardware description language is a prime block, determining, using the computer hardware, an output vector corresponding to an output of the prime block, and replacing, using the computer hardware, contents of the prime block with an accelerated simulation model specified in a high level language. The accelerated simulation model can determine a value for the output of the prime block as a function of values of one or more inputs of the prime block using the output vector. The method can include elaborating, using the computer hardware, the circuit design and compiling, using the computer hardware, the circuit design into object code that is executable to simulate the circuit design.

In another aspect, a system includes a processor configured to initiate operations. The operations can include determining that a design unit of a circuit design specified in a hardware description language is a prime block, determining an output vector corresponding to an output of the prime block, and replacing contents of the prime block with an accelerated simulation model specified in a high level language. The accelerated simulation model can determine a value for the output of the prime block as a function of values of one or more inputs of the prime block using the output vector. The operations also can include elaborating the circuit design and compiling the circuit design into object code that is executable to simulate the circuit design.

In another aspect, a method includes, during a simulation of a circuit design using computer hardware, determining values of inputs to an accelerated simulation model of a design unit of the circuit design, wherein the design unit is a prime block and, during the simulation, computing an index based on the values of the inputs. The method also can include, during the simulation, determining a value for an output of the accelerated simulation model by selecting the value from an output vector of the accelerated simulation model based on the index. The output vector can be implemented as a one dimensional array of values corresponding to the output of the accelerated simulation model.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
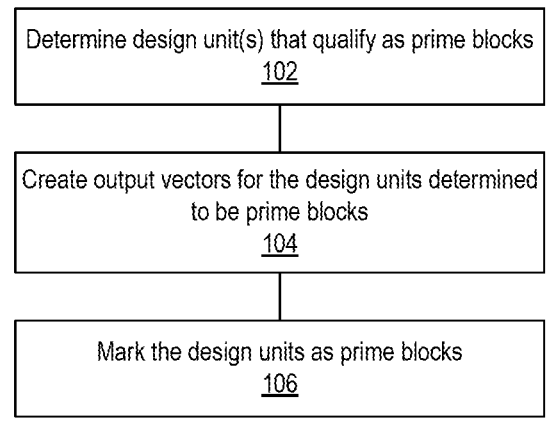
FIG. 1 illustrates an example method of designating design units of a circuit design as prime blocks.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to computer-based simulation of circuit designs and, more particularly, to functional simulation. In general, simulation of circuit designs can be broken down into two different categories referred to as timing simulation and functional simulation. Timing simulation seeks to model signal propagation delays throughout the circuit design. Functional simulation seeks to model the functionality, e.g., values of signals, of the circuit design. Functional simulation typically disregards timing aspects of the circuit design.

In the context of functional simulation, "hardware description language simulation" or "HDL simulation" refers to a technique for testing the behavior of hardware implemented from a circuit design specified in HDL. HDL simulation involves building an executable model of the circuit design originally specified in HDL. The circuit design is often referred to as the "design under test" or "DUT". In general, HDL simulation includes two phases. The first phase is referred to as compilation. During compilation, the DUT is parsed, elaborated, and executable program code (e.g., object code) is generated from the DUT. The second phase is a runtime phase where the object code generated during compilation is loaded into memory of a computer system and executed to perform simulation.

In implementing a circuit design (e.g., within an integrated circuit), electronic design automation (EDA) tools perform operations such as synthesis, placement, and routing. A synthesis tool, for example, may perform synthesis, at least in part, by mapping design units of a circuit design specified in HDL to particular circuit blocks and/or circuit elements such as look-up tables (LUTs) and/or buffers available on the target IC. In the context of functional simulation, a simulator simulates the circuit design using models of these circuit blocks interconnected in the same manner as in the circuit design. For example, the simulator connects LUT models and/or buffer models with connectivity matching the connectivity of the circuit design to build a model of the overall circuit design.

In conventional functional simulators (e.g., HDL functional simulators), the circuit block models simulate nearly every aspect of the physical circuit block on the target IC. This includes modeling operating of the internal elements of the circuit block. For example, each circuit block model may include a hierarchy of internal wires, signals, and/or other circuit elements intended to simulate or mimic operation of the actual internal circuit structure of the circuit block being modeled. The simulator simulates the circuit design by propagating values on the inputs of the circuit design to inputs of the various circuit block models, through the modeled internal components of the respective circuit block models, to the outputs of the circuit block models, and so forth until the outputs of the circuit design are reached. In some cases, simulating certain circuit block models, for example, circuit block models represented internally using primitive tables, is more computationally expensive than simulating the equivalent combinational circuits represented by the circuit block models.

In accordance with the inventive arrangements described within this disclosure, a system is capable of evaluating a circuit design to detect or identify design units that are considered to be prime blocks. Design units that meet predetermined criteria may be designated as prime blocks. In general, the system is capable of replacing each design unit designated as a prime block with a functionally equivalent accelerated simulation model. The accelerated simulation models used to replace prime blocks are accelerated in the sense that the models may be executed by the system in less time than conventional models that seek to simulate nearly and/or most aspects of the prime block.

In an example implementation, by replacing a prime block with an accelerated simulation model, the system effectively prunes away the inner workings of the prime block. The accelerated simulation model used to replace each respective prime block is functionally equivalent to the respective prime block. The output of the accelerated simulation model may be determined purely as a function of the inputs to the accelerated simulation model. By removing and/or eliminating the inner workings of each prime block, the accelerated simulation models facilitate faster simulation of the overall circuit design and require less computational resources of the system (e.g., less runtime memory). This means that not only may the system perform functional simulation faster than other conventional functional simulation techniques, the system may also simulate larger circuit designs due to the reduced runtime memory footprint of the accelerated simulation models during simulation.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example method 100 of designating design units of a circuit design as prime blocks. Method 100 may be performed by a designer using a computer system (system) executing suitable operational software to perform the operations described. An example of a system capable of performing the operations of FIG. 1 is described in connection with FIG. 7.

Method 100 may begin in a state where a designer has created a circuit design. The circuit design may be specified using an HDL. As generally understood, HDLs are used to describe digital circuits. HDLs allow a designer to create a definition of a digital circuit design at the gate level, the register transfer level (RTL), or the behavioral level using abstract data types. The system, executing one or more suitable EDA tool(s), is capable of operating on the circuit design to perform simulation and/or implement the circuit design within an IC. Examples of HDLs include, but are not limited to, Verilog, SystemVerilog, and VHDL.

In block 102, design units of the circuit design that qualify as prime blocks are determined. The phrase "design unit," as used herein, means a portion of HDL specifying a circuit design. In one aspect, a design unit is a logical partition of the HDL. Design units facilitate the implementation of synthesis. Design units may refer to small portions of the circuit design such as, for example, first-in-first-out (FIFO) memories and/or state machines, to more complex circuit blocks such as interfaces (e.g., Peripheral Component Interconnect Express or "PCIe" interfaces) and/or DSP data paths. Design units may be structurally and functionally distinct from other design units and, as such, may be separately named and referenced within the circuit design. In Verilog, an example of a design unit is a module. In VHDL, examples of design units include, but are not limited to, entities, packages, and/or configuration declarations.

To qualify as a prime block, a design unit must meet predetermined criteria. The predetermined criteria for a design unit to be considered a prime block include the following:

The design unit must have one or more outputs where each output is dependent only on some combination of all of the inputs or some combination of fewer than all of the inputs to the design unit.

Each input and each output of the design unit can take a value of {0 or 1} or {0, 1, or X}. In this example, "X" means "unknown". In cases where the input(s) or output(s) of the design unit can have a "Z" value, such Z value may be considered an X value. In this example a "Z" value means a tristate or high impedance value.

There is no timing within the design unit. As such, the output(s) of the design unit change in response to changes in the inputs without any delay.

The design unit has no side effects or interaction with the circuit design (e.g., no impact on the circuit design) other than through the input port(s) and the output port(s) of the design unit.

The design unit has no signal and or wire inside for which debugging is required during simulation. Such is the case since, in general, only input(s) and output(s) of design units considered to be prime blocks are preserved for purposes of simulation. Internal signals and/or wires and other circuit elements are pruned (e.g., deleted or discarded).

A design unit that meets each criterion described above may be considered a prime block.

Examples of design units that are considered prime blocks include, but are not limited to, a Verilog module (or other comparable construct in another HDL) that includes only combinatorial logic. Examples of combinatorial logic include Boolean logic gate circuit elements such as AND, OR, XOR, NAND, NOR, XNOR, and NOT gates. Combinatorial logic is not clocked. Another example of a design unit considered to be a prime block is one that includes only buffers. Examples of different buffers include, but are not limited to, single input and multi-input buffers (e.g., IBUF and BUF structures). Still another example of a design unit considered to be a prime block is one that includes only LUTs. Examples of different LUTs include different LUT devices such as LUT2, LUT3, LUT4, LUT5, and/or LUTE (e.g., corresponding to 2, 3, 4, 5, and 6 bit look-up tables, respectively).

In other cases, a design entity may include a mixture of one or more of combinatorial gates and one or more buffers; one or more combinatorial gates and one or more LUTs, one or more buffers and one or more LUTs; or one or more of each of combinatorial gates, buffers, and LUTs.

In block 104, output vectors for the design units determined to be prime blocks are created. Each prime block includes or specifies one output vector for each output. If a prime block has multiple outputs, each output has a corresponding output vector. An output vector describes the relationship between the input(s) or selected input(s) of the prime block with the output of the prime block.

In one aspect, an output vector may be implemented as a two-state vector. Each output vector may be formed such that an integer specified by assigning a value (e.g., a single bit value) to each input of the prime block from least significant bit (LSB) to most significant bit (MSB) may be used to index into the two-state vector (e.g., where each bit of the vector is a 0 or a 1 value). The integer, also referred to as an "index", specifies the index into the two-state vector used to determine the value of the output of the prime block given the input values. An illustrative and non-limiting example of creating an output vector for output of a prime block is to create a truth table for the output where the output corresponds to a column of the truth table. The column of values for the output may be used as the two-state vector (e.g., where the remainder of the truth table is discarded). In this sense, the output vector may be implemented as a one dimensional array.

In block 106, the design units that qualify as prime blocks are marked as prime blocks in the circuit design. The design units that qualify as prime blocks may be marked or otherwise indicated within the circuit design using a marking data structure. The marking data structure may be implemented using any of a variety of different techniques. For example, prime blocks may be designated as such using marking data structures including, but not limited to, specialized pragmas and/or attributes to guide simulation. Examples 1-6 below illustrate different marking data structures that may be used to designate a design unit as a prime block.

Within Examples 1-6, the syntax of the marking data structure (e.g., special pragmas and/or attributes) used may be fixed by the particular system and/or simulator used. In addition, the marking data structures illustrated below provide a way to specify an output vector for each output of a prime block. Each output vector describes the relationship between the inputs of the prime block and a particular output of the prime block to the simulator.

Example 1 below illustrates the case where the marking data structure is an attribute. In Example 1, the attribute marks a Verilog module as a prime block.

Example 1

(* XIL_PRIME_BLOCK="F=32'h66D475AF inputs=A, B, C, D, E" *)
module_sampl_du(input A, input B, input C, input D, input E, output F);
. . .
endmodule In Example 1, the output vector corresponding to "F" is 32'h66D475AF. The prime block includes 5 inputs corresponding to A, B, C, D, and E.

Example 2 below illustrates the case where the marking data structure is a pragma. In Example 2, the pragma marks a Verilog module as a prime block.

Example 2

// XIL_PRIME_BLOCK="F=32'h66D475AF inputs=A, B, C, D, E" *)
module_sampl_du(input A, input B, input C, input D, input E, output F);
. . .
endmodule Example 3 below illustrates the case where the marking data structure uses a generic and a parameter of the design unit directly to specify the output vector.

Example 3

(*XIL_PRIME_BLOCK="O=INIT inputs=I0,I1,I2" *)
module LUT3 # (parameter [7:0] INIT=8'h00)
  (output O, input I0, input I1, input I2);
. . .
endmodule The use of prime blocks is not intended to be limited to a particular type of HDL such as Verilog. Examples of marking prime blocks in VHDL are shown below. Example 4 illustrates the case where the marking data structure is a pragma. In Example 4, the pragma marks a VHDL entity as a prime block.

Example 4

--XIL_PRIME_BLOCK="O=INIT inputs=I0,I1,I2"
entity LUT3 is
  generic(
    INIT: bit vector(7 downto 0):=X"00")
    );

port(
   O: out std_ulogic;
   I0: in std_ulogic;
   I1: in std_ulogic;
   I2: in std_ulogic
   );
end LUT3;

In other cases, simulators may pre-define templates for prime blocks and provide a convenient way for a designer to apply the prime block templates to design units. For example, a simulator may allow classification of a design unit directly as a "LUT3" device model using a particular marking data structure such as a pragma and/or an attribute. Example 5 illustrates the case where a user identifies a design unit with such a template for a prime block. In Example 5, the template is for a LUT3 device model.

Example 5

(* XIL_PRIME_BLOCK="LUT3" *)
module_LUT3 # (parameter [7:0] INIT=8'h00)
   (output O, input I0, input I1, input I2);
. . .
endmodule Once a user classifies a design unit as a prime block using a template, e.g., LUT3 in this example, the simulator is capable of automatically identifying the design unit as a prime block having the same attributes specified by the template. In the case of Example 5, the simulator determines that the prime block has the attributes of a LUT3 device model meaning that the simulator automatically identifies the design unit as a prime block having 3 input ports (I0, I1, and I2), one output port (O), and the output vector specified by the parameter/generic named INIT.

Figure 2:
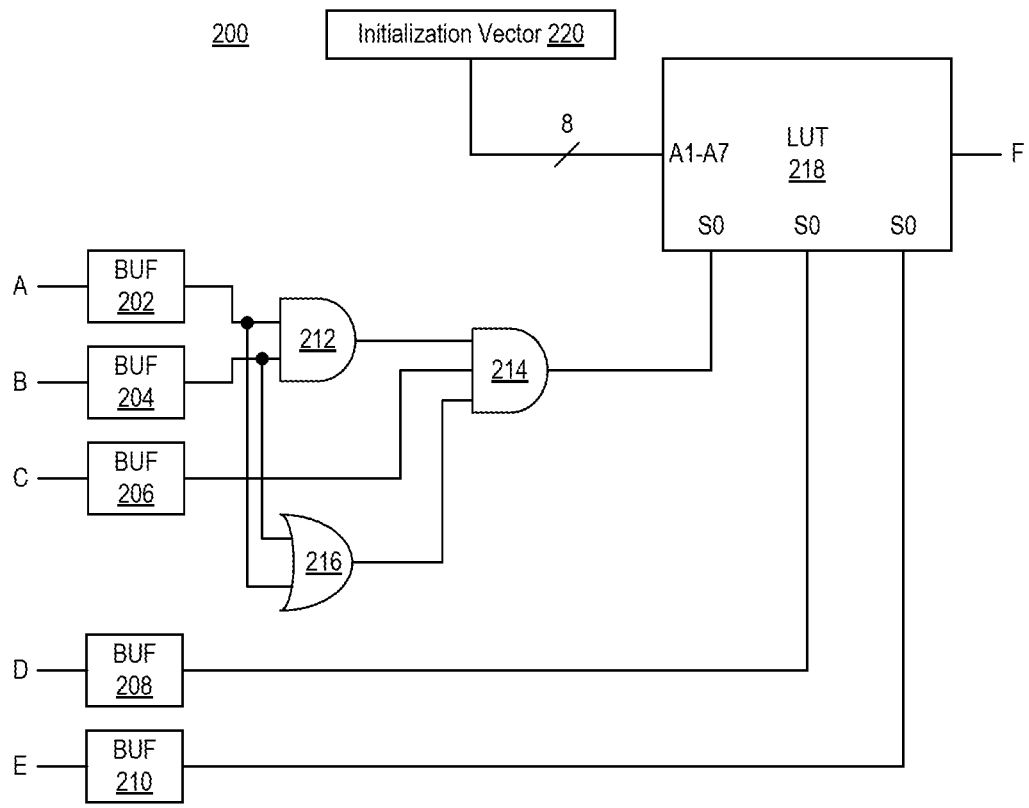
FIG. 2 illustrates an example of a design unit.

FIG. 2 illustrates an example of a design unit 200. Design unit 200 is an example of a prime block. As pictured, design unit 200 includes a plurality of buffers 202, 204, 206, 208, and 210, AND gates 212 and 214; OR gate 216, and a LUT 218. The example of design unit 200 is shown for purposes of illustration only. As discussed, a prime block may include different combinations and/or sub-combinations of the circuit elements shown (e.g., all logic gates, all LUTs, all buffers, or combinations thereof).

In the example of FIG. 2, design unit 200 includes inputs A, B, C, D, and E provided to buffers 202, 204, 206, 208, and 210, respectively. Output F is generated by LUT 218. Further, LUT 218 is initialized using an 8-bit initialization vector 220. For purposes of illustration, LUT 218 is a LUT3 type of LUT.

Figure 3:
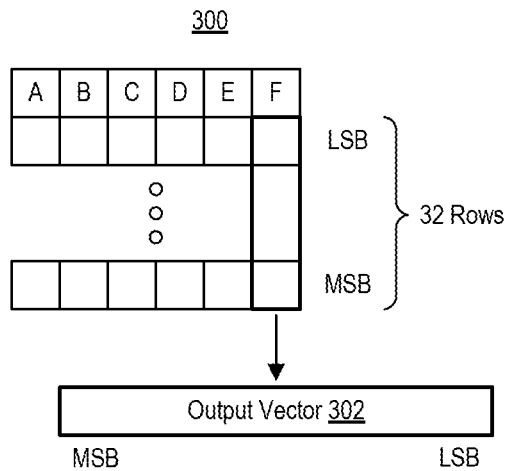
FIG. 3 illustrates an example technique for generating an output vector for a design unit.

FIG. 3 illustrates an example technique for generating an output vector for design unit 200 of FIG. 2. In the example of FIG. 3, a truth table 300 for design unit 200 is shown. Truth table 300, corresponding to design unit 200 having 5 inputs would typically have 2^5 rows (e.g., 32 rows). The particular values of these rows and/or columns are not shown. In an example implementation, output vector 302 for design unit 200 is the column corresponding to the F output. In this example, output vector 302 is a one-dimensional, 32-bit array. Output vector 302 has one bit for each row in truth table 300. As discussed, design units considered to be prime blocks have one output vector for each output. Since design unit 200 has one output F, one output vector 302 is generated. If design unit 200 had another output, another output vector for that output would be created using the technique illustrated in FIG. 3.

Figure 4:
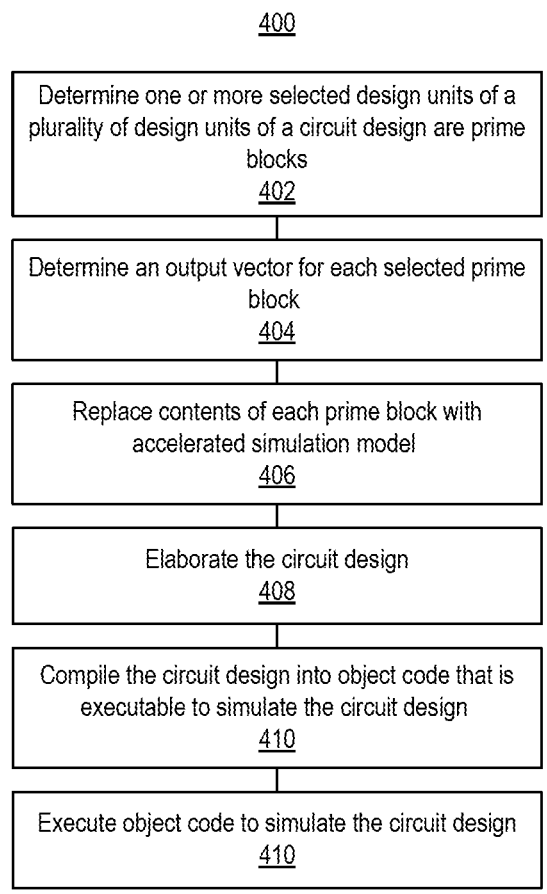
FIG. 4 illustrates an example method of using prime blocks for simulating a circuit design.

FIG. 4 illustrates an example method 400 of using prime blocks for simulating a circuit design. Method 400 may be performed by a computer system (system) executing suitable operational software to perform the operations described. An example of a system capable of performing the operations of FIG. 4 is described in connection with FIG. 7. Method 400 may begin in a state where a circuit design specified in an HDL has undergone processing as described in connection with FIG. 1. The circuit design includes one or more design units that have been marked as prime blocks.

In block 402, the system is capable of determining that one or more design units (e.g., "selected design units") of a plurality of design units of a circuit design are prime blocks. The circuit design may be specified in an HDL. For example, the system is capable of parsing the HDL of the circuit design to detect any marking data structures (e.g., pragmas, attributes, parameters, or generics) indicating that a design unit (or design units) is a prime block. As an example, the system is capable of detecting the marking of a design unit as a prime block by detecting any of the example data structures illustrated in Examples 1-5. In many different circuit designs, a significant number of design units may be marked as prime blocks. As noted, the use of accelerated simulation models for prime blocks results in faster simulation runtimes and reduced runtime memory usage. The larger the number of prime blocks included in a circuit design, the larger the benefits.

In block 404, the system is capable of determining the output vector for each prime block. The system is capable of extracting the output vector from the marking data structure used to designate the respective design units as prime blocks as described and illustrated in connection with Examples 1-5. The output vector(s) for each prime block and corresponding accelerated simulation model may be stored in a data structure associated with the respective accelerated simulation model or as part of (e.g., within) the accelerated simulation model. In the former case, each different instance of a same accelerated simulation model need not store a duplicative copy of the output vector. Rather, each instance of the accelerated simulation model may access the data structure (e.g., a single data structure) storing the output vector.

In block 406, the system is capable of replacing the contents (e.g., HDL) of each prime block with an accelerated simulation model for the prime block. The accelerated simulation model may be specified in a high-level language (e.g., as source code). Examples of a high-level language include C or C++ source code. The accelerated simulation model for a given prime block is capable of determining the output of the prime block as a function of one or more inputs of the prime block using the output vector. Examples 6 and 7 illustrate examples of accelerated simulation models that may be used to replace the content of a prime block.

In block 408, the system is capable of elaborating the circuit design. For example, the system is capable of expanding (e.g., flattening) the HDL and accelerated simulation model(s) and linking the various design units and accelerated simulation model(s) of the circuit design. Accelerated simulation models, or calls thereto, may be replicated as part of the flattening process.

During elaboration, the system does not elaborate the contents (e.g., HDL) of the prime blocks. This means that, for each prime block, there are no internal signals, objects, or other circuit hierarchies that are to be created (e.g., through compilation) in object code for any instances of any prime block of the circuit design. Internal wires, signals, or other circuit structures of the prime blocks, having been removed and replaced with the accelerated simulation models, are not be visible within any user interface of the simulator and are not available to the user for debugging during the simulation.

In one aspect, only the input(s) and the output(s) of each prime block are available and/or observable by the user during simulation. In some cases, when, for example, an internal state and/or memory of a selected design unit is referenced in the marking of the selected design unit as a prime block, that structure may be preserved (e.g., represented as a design object during compilation) and be available and/or observable by the user during simulation.

In block 410, the system is capable of compiling the circuit design. For those design units not considered prime blocks, the system is capable of generating functionally equivalent object code from the HDL for purposes of simulation. As noted, such object code models the entirety, or substantially the entirety, of the design unit including the internal circuit structure of the design units specified by the HDL. For each prime block, the system compiles the accelerated simulation model. In this regard, the object code generated by the system comes from the generating object code from both the HDL portions of the circuit design and the accelerated simulation model(s) of the circuit design.

In block 412, the system is capable of executing the object code to simulate the circuit design. As discussed, the lightweight nature of the accelerated simulation models results in less runtime memory usage while simulating the circuit design and faster execution of the simulation. In general, the object code for each of the compiled accelerated simulation models performs a lookup operation into the output vector for each output of the accelerated simulation model based on the values of the inputs accelerated simulation model. The value determined by indexing into the output vector is used as the value of the output, corresponding to the vector, for the prime block. This value may be determined without simulating any of the internal circuit structure of the design unit.

Example 6 illustrates an accelerated simulation model in C++ for a prime block having three 2-state inputs and one output.

Example 6

```
uint8_t accelerated_model_2_state_3_input (
    uint8_t i0_val, uint8_t i1_val, uint8_t i2_val, uint8_t
       q_vec)
{
    uint8_t idx=(i0_val<<0)|(i1_val<<)|(i2_val<<2);
    return ((q_vec>>idx) & 0x1)==1? VAL_1:VAL_0;
}
```

Example 6 illustrates how the index (idx) into the output vector (q_vec) is computed. In the example, the value of i0_val is shifted by 0, the value of i1_val is shifted by 1, and the value of i2_val is shifted by 2. If, for example, the prime block had more inputs, the pattern would continue with each incremental input being incrementally shifted. In Example 6, this results in a 3 bit value arranged with i0_val being the LSB, i1_val being the middle value, and i2_val being the MSB of the index. The index specifies a bit position in the output vector from which a value is obtained and used as the value of the output for the prime block during simulation. In other words, the accelerated simulation model creates an integer index with Nth bit as the value of the Nth input starting from the LSB. The accelerated simulation model obtains the value at the indexed bit location in the output vector. This value is used as the output of the prime block.

Example 7 illustrates an accelerated simulation model written in C++ for a prime block having three 4-state inputs (e.g., 0, 1, X, and Z).

Example 7

```
uint8_t accelerated_model_4_state_3_input
uint8_t i0_aval, uint8_t i0_bval,
uint8_t i1_aval, uint8_t i1_bval,
uint8_t i2_aval, uint8_t i2_bval,
uint8_t q_vec)
{
uint8_t i0Val=i0_aval <<0;
uint8_t i1Val=i1_aval <<1;
uint8_t i2Val=i2_aval <<2;
uint8_t i0Unk=i0_bval <<0;
uint8_t i1Unk=<<1;
uint8_t i2Unk=i2_bval <<2;
uint8_t idxUnk=i2Unk|i1Unk|i0Unk;
uint8_t idxVal=i2Val|i1Val|i0Val;
switch (idxUnk) {
    case 0: // 2Unk=0|i1Unk=0|i0Unk=0;
        return ((q_vec>>idxVal) & 0x1)==1? VAL_1:
            VAL_0;
    case 1: // i2Unk=0|i1Unk=0|i0Unk=1;
        uint8_t val1=(q_vec>>idxVal) & 0x1;
        uint8_t val2=(q_vec>>(idxVal & ~i0Val)) & 0x1;
        if (val1==val2)
            return (val1==1)? VAL_1:VAL_0
        else
            return VAL_X; // 'X'
        break;
    case 2: // i2Unk=0|i1Unk=1|i0Unk=0;
        . . .
        break;
    case 3: // i2Unk=0|i1Unk=1|i0Unk=1;
        uint8_t val1=(q_vec>>idxVal) & 0x1;
        uint8_t val2=(q_vec>>(idxVal & ~i0Val)) & 0x1;
        uint8_t val3=(q_vec>>(idxVal & ~i1Val)) & 0x1;
        uint8_t val4=(q_vec>>(idxVal & ~i1Val & ~i0Val))
            & 0x1;
        if (val1==val2 && val2==val3 && val3==val4)
            return (val1==1)? VAL_1:VAL_0;
        else
            return VAL_X; // 'X'
        break;
    case 4: // i2Unk=1|i1Unk=0|i0Unk=0;
        . . .
    case 5: // i2Unk=1|i1Unk=0|i0Unk=1;
        . . .
    case 6: // i2Unk=1|i1Unk=1|i0Unk=0;
        . . .
    case 7: // i2Unk=1|i1Unk=1|i0Unk=1;
        if (q_vec==0) {// Constant '0'
            return VAL_0;
        } else if (q_vec==255) {// Constant '1'
            return VAL_1;
        } else {
            return VAL_X; // 'X'
        }
    default:
        assert(0); // Should not be here
        break;
}
return VAL_X;
```

In Example 7, the accelerated simulation model is capable of operating as follows. In the event that any one input to the prime block has an X value, the system creates two different indexes. The first index is formed by replacing the X with the value 0. The second index is formed by replacing the X with the value 1. The system retrieves a value from the output vector using each of the two indexes. In response to determining that the two retrieved values are different, the system determines that the value of the output for the prime block is X. Otherwise, when the two retrieved values are the same (e.g., either 0 or 1), the system outputs the common or same value as the output of the prime block.

In the case where there is more than one input to the prime block having a value of X, the system generates an index for each possible combination of input values where the X values are replaced with the value 0 and the value 1. For example, if two inputs had values of X, the system would generate four different indexes. The system treats Z values on inputs as X values for the purposes of simulation.

The examples provided within this disclosure are provided for purposes of illustration and not limitation. Accelerated simulation models may be implemented differently than illustrated and/or using different languages. In some cases, a simulator may maintain a library of accelerated simulation models that may be invoked. Whether the system provides a library of accelerated simulation models or not, an accelerated simulation model may be implemented to conform to the guidelines below:

The accelerated simulation model creates an integer index with the Nth bit as the value of the Nth input starting from the LSB.

The accelerated simulation model obtains the value at the indexed bit location in the output vector. This value is used as the output of the prime block.

Handling of 4-state data types is as follows:
  If any input is X, create two different indexes where the first index replaces X with the value 0 and the second index replaces X with the value 1. If the determine outputs using the indices are different, the output of the expression (e.g., the prime block) is X, otherwise the output of the expression is the value common to both indexes.
  If there is more than one input having the value X, generate an index for each possible combination of 0 and 1 for the values of X.
  Treat Z values on inputs as X values.

Figure 5:
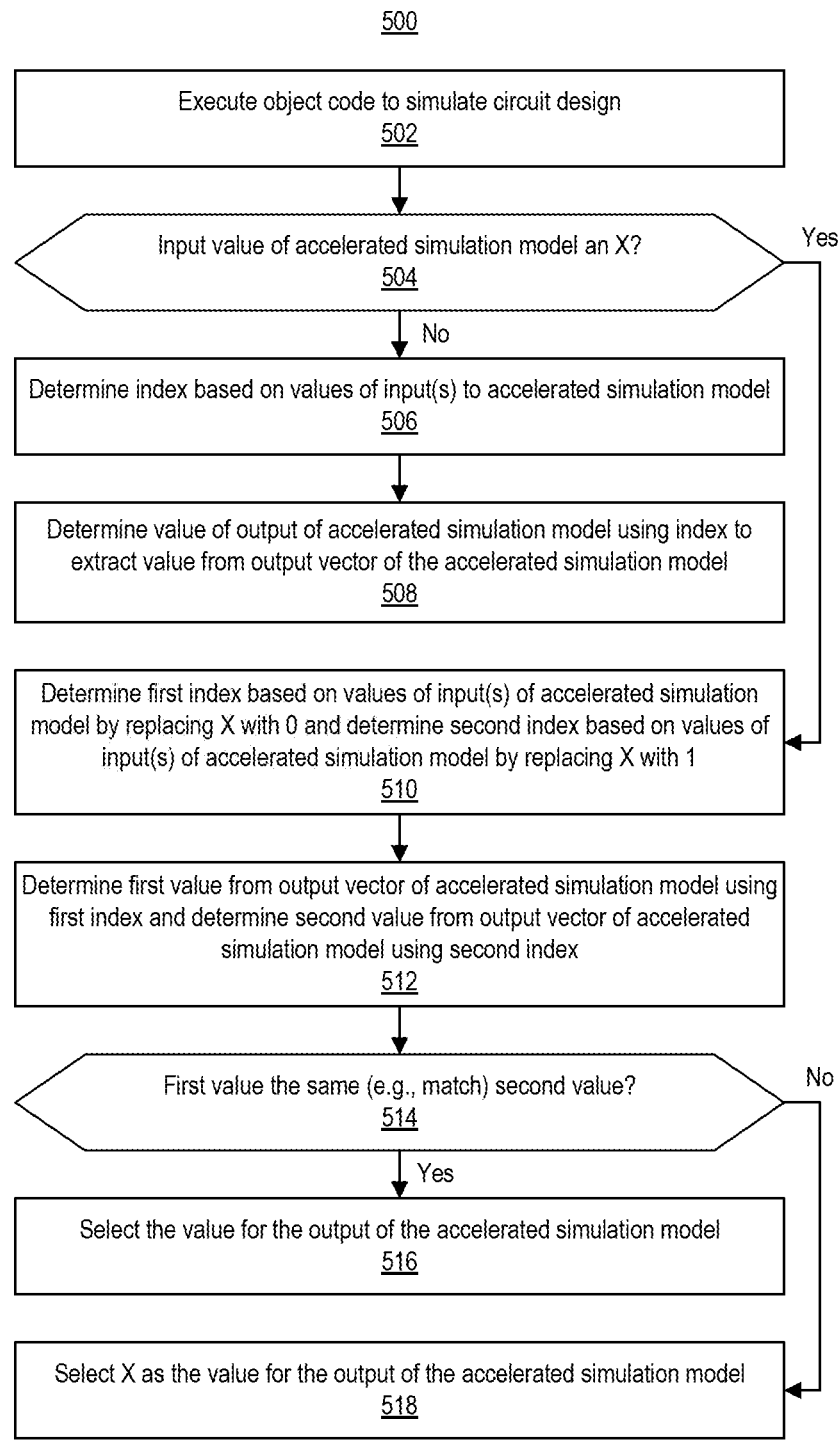
FIG. 5 illustrates an example method of simulating a circuit design using accelerated simulation models.

FIG. 5 illustrates an example method 500 of simulating a circuit design using accelerated simulation models. Method 500 may be performed by a computer system (system) executing suitable operational software to perform the operations described. An example of a system capable of performing the operations of FIG. 5 is described in connection with FIG. 7. Method 500 may begin in a state where a circuit design has been processed as described in connection with FIG. 4. As such, an object code representation of the circuit design has been generated that includes one or more compiled accelerated simulation models.

In block 502, the system begins executing the object code generated from the circuit design to simulate the circuit design. For purposes of discussion, execution of an accelerated simulation block is described. Accordingly in block 504, the system determines whether the accelerated simulation model has an input with an X value. As noted, a Z value is treated as an X value. In response to determining that each input of the accelerated simulation model has a value of 0 or 1 (e.g., no input to the accelerated simulation model has a value of X), method 500 proceeds to block 506.

In response to determining that an accelerated simulation model has one or more inputs with an X value, method 500 continues to block 510.

Blocks 506 and 508 illustrate example operations performed in executing the accelerated simulation model where the inputs to that accelerated simulation model have values of 0s and or 1s (e.g., there is no X value for any input of the accelerated simulation model).

Figure 6:
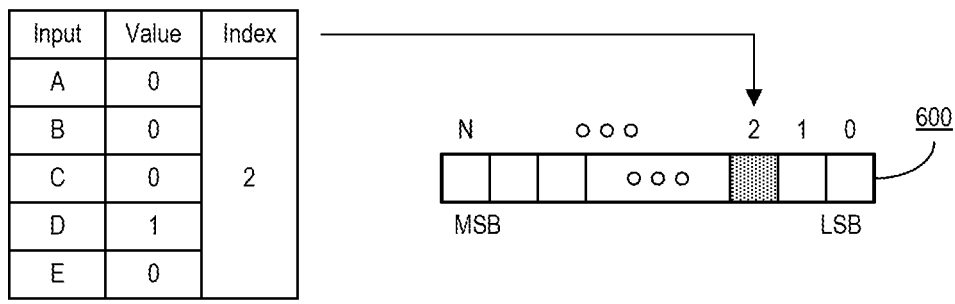
FIG. 6 illustrates an example technique for computing an index.

In block 506, the system determines an index based on values of the inputs provided to the accelerated simulation model. FIG. 6 illustrates an example technique that may be used to compute the index. The values of the inputs to the accelerated simulation model are used to generate the index. In this example, the accelerated simulation model includes inputs A, B, C, D, and E. The values of the inputs are 0, 0, 0, 1, and 0, respectively, resulting in a value of 2 for the index.

In block 508, the system determines the value of the output of the accelerated simulation model using the index determined in block 506 to extract a value from the output vector for the accelerated simulation model. Referring again to the example of FIG. 6, the system starts at the LSB of output vector 600 and selects the second bit position as the value of the output for the accelerated simulation model.

Referring to the example of FIG. 6, the system is capable of shifting the vector 2 bits to the right leaving the entire output vector except for the rightmost 2 bits (e.g., bits 0 and 1). The system may then remove the left most bits by performing an AND operation on each bit position except for the desired bit position of 2 (which is now the right-most bit position of the output vector). The AND operation leaves the desired bit position as the output for the accelerated simulation model.

Blocks 510 through 518 illustrate example operations performed by the system in cases where a value of one input to the accelerated simulation model has an X value. In block 510, the system determines a first index based on values of inputs of the accelerated simulation model where the X value is replaced with a 0 value. Further, the system determines a second index based on values of inputs of the accelerated simulation model where the X value is replaced with a 1 value. After performing block 510, the system has a first index and a second index for the accelerated simulation model.

In block 512, the system determines a first value from the output vector of the accelerated simulation model using the first index. Further, the system determines a second value from the output vector of the accelerated simulation model (e.g., the same accelerated simulation model and, thus, the same output vector) using the second index. The system is capable of determining the first value and the second value as generally described in connection with block 508 and FIG. 6. In block 514, the system determines whether the first value is the same as (e.g., matches) the second value.

In response to determining that the first value and the second value are the same, method 500 continues to block 516 where the system selects the value as the output for the accelerated simulation model. Since the values are the same, either the first value or the second value may be selected. In response to determining that the first value in the second value are not the same, method 500 continues to block 518 where the system selects X is the value for the output of the accelerated simulation model.

As previously discussed, in cases where an accelerated simulation model has input values with more than one X value, the system generates an index for each possible combination that may result by replacing the X values with 0s and 1s. In such cases, the system still performs blocks 516 and 518 as described albeit using more than two values. Further, as noted, the system treats Z values on inputs as X values for the purposes of simulation.

In another example implementation, expressions that involve vectors are typically converted into multiple sub-expressions each capable of operating on single or particular bits (e.g., a subset of bits) of the vector operands. These sub-expressions share the structure (e.g., binary decision tree) of the original expression with the difference being the operands. These different sub-expressions within the same binary decision tree would have the same output vector. In such cases, the vector ports of the design unit may be directly used or specified in the marking data structure (e.g., in an attribute and/or pragma). The system, during simulation, may bit-blast the vectors and apply output vector to each bit to arrive at the final (vector) output of the accelerated simulation model for a prime block.

For purposes of illustration, consider a prime block having 4-bit packed vector output O, and two 4-bit packed vector inputs I0 and I1, with an underlying expression O=I0 & I1. This underlying expression can be bit blasted into 4 sub-expressions having scalar operands as follows:

$$O[0]=I0[0] \& I1[0]$$

$$O[1]=I0[1] \& I1[1]$$

$$O[2]=I0[2] \& I1[2]$$

$$O[3]=I0[3] \& I1[3]$$

These sub-expressions have the same structure as the original expression, with the difference being the operands. Since the binary decision tree of these expressions is the same, the sub-expressions share the same output vector. In such cases, e.g., where the inputs and outputs of a prime block are vectors, the accelerated simulation model is implemented to bit-blast these inputs and outputs and apply the same output vector on each bit to arrive at the bits of the output vector (O[0], O[1], O[2], and O[3]). For example, to calculate O[0], the system calculates an index into the output vector using I0[0] and I1[0]. To calculate O[1], the system uses the same output vector, but calculates the index using I0[1] and I1[1], and so on. Once all the output bits are calculated, the system combines the output bits to form the vector output of the prime block.

Example 8 illustrates a prime block with vector inputs and outputs.

Example 8

(*XIL PRIME BLOCK="O=INIT inputs=I0,I2,I2"*)
module-LUT3MULTIBIT #(parameter [7:0] INIT=8'h00)
    (output [3:0] O, input [3:0] I0, input [3:0] I1, input [3:0] I2);
    . . .
endmodule In another example implementation, accelerated simulation models may support internal states and/or internal memories for a prime block. Internal states and/or internal memories of prime blocks are capable of functioning as an input during calculation of an output of the prime block and acting as an output while updating the state and/or memory itself based on the inputs to the prime block at various stages during simulation. An accelerated simulation model may support states and/or memories inside a prime block for one or more different scenarios. These scenarios have a deterministic and/or fixed order of value updates from the inputs to the states and/or memories and outputs of the prime block. This order may be provided to the system (e.g., the simulator) using the order of output vectors in the marking structure used to designate a design unit as a prime block. For example, the output vectors can be applied, and the outputs evaluated in the order in which the outputs are specified in the marking structure.

For instance, in Example 9, the system evaluates the output "O" first using inputs and the previous value of state S1 before evaluating and updating the state S1 using the inputs of the prime block and the previous value of 51.

Example 9

(* XIL_PRIME_BLOCK="O=16'h66D4 inputs=I0,I1,I2, S1 S1=16'h6A94 inputs=I0,I1,I2,S1"*)
module SAMPLE_DU_WITH_STATE(output O, input I0, input I1, input I2);
    bit S1; // state
    . . .
endmodule In cases where the marking data structure such as in Example 9 references an internal state (e.g., S1) and/or an internal memory, compilation of the accelerated simulation model generates an object for tracking such states and/or memories that may be used during simulation. The object(s) are in addition to those created for input(s) and output(s) of the prime block. By maintaining these objects for the internal states and/or memories, these structures would be visible and/or accessible by users via a user interface of the system for probing during simulation.

Figure 7:
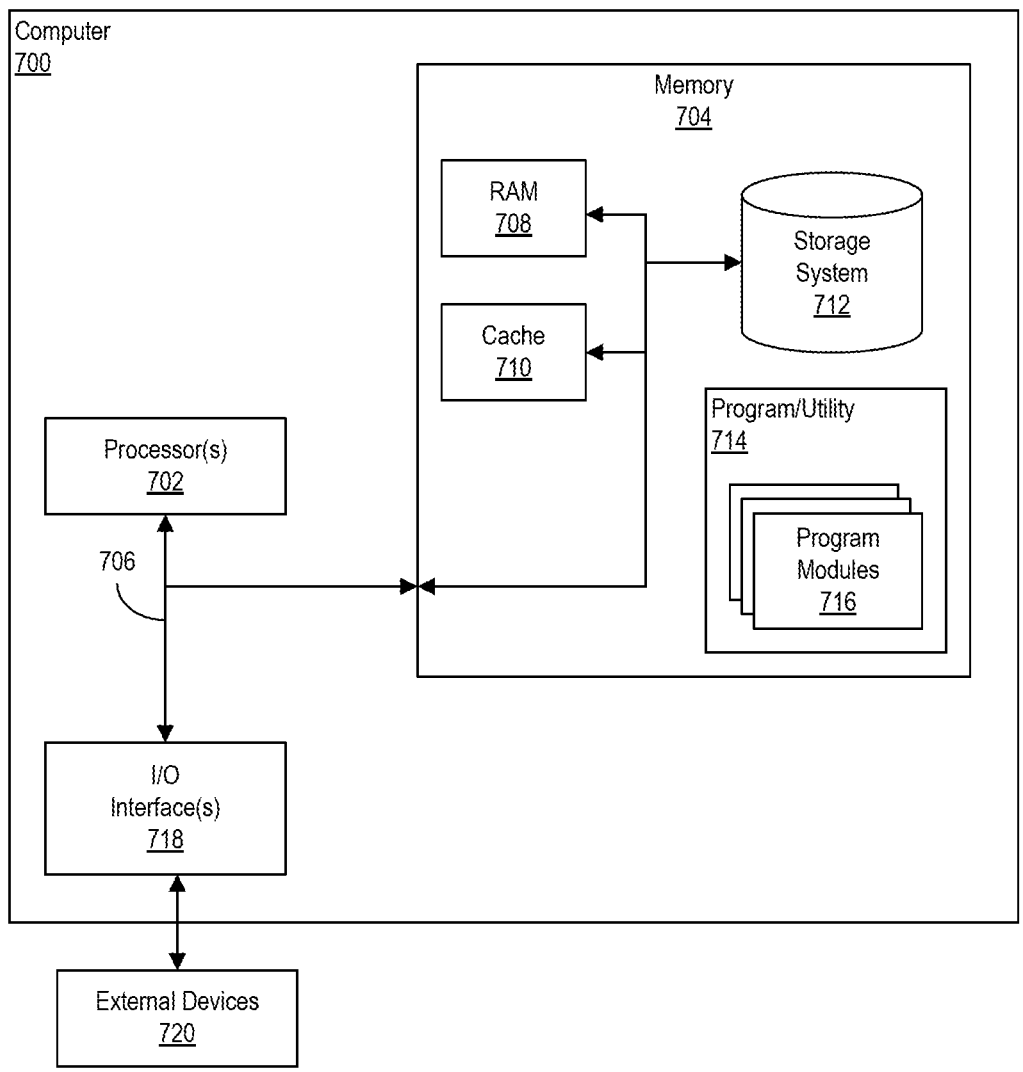
FIG. 7 illustrates an example of a computer system for use with one or more embodiments described herein.

FIG. 7 illustrates an example computer 700 for use with the inventive arrangements described within this disclosure. Computer 700 can include one or more processors 702 (e.g., central processing units), a memory 704, and a bus 706 that couples various system components including memory 704 to processor(s) 702. Processor(s) 702 may include any of a variety of processors that are capable of executing program code. Example processor types include, but are not limited to, processors having an x86 type of architecture (IA-32, IA-64, etc.), Power Architecture, ARM processors, and the like.

Bus 706 represents one or more of any of several types of communication bus structures, including a memory bus or memory controller, a peripheral bus, an accelerated graphics port, and a processor or local bus using any of a variety of available bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, and PCI Express (PCIe) bus.

Computer 700 typically includes a variety of computer readable media. Such media may be any available media that is accessible by computer 700 and may include any combination of volatile media, non-volatile media, removable media, and/or non-removable media.

Memory 704 may include computer readable media in the form of volatile memory, such as random-access memory (RAM) 708 and/or cache memory 710. Computer 700 may also include other removable/non-removable, volatile/non-volatile computer system storage media. By way of example, storage system 712 may be provided for reading from and writing to a non-removable, non-volatile magnetic media and/or solid state drive (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to bus 706 by one or more data media interfaces. As will be further depicted and described below, memory 704 may include at least one computer program product having a set (e.g., at least one) of program modules (e.g., program code) that are configured to carry out the functions and/or operations described within this disclosure.

For example, program/utility 714, having a set (at least one) of program modules 716 which may include, but are not limited to, an operating system, one or more application programs (e.g., user applications), other program modules, and/or program data, is stored in memory 704. Program modules 716 generally carry out the functions and/or methodologies as described herein at least with respect to operations performed by computer 700. For example, program modules 716 may implement one or more EDA tools, compilers, and/or simulators capable of performing the operations described.

Program/utility 714 is executable by processor(s) 702. Program/utility 714 and any data items used, generated, and/or operated upon by processor(s) 702 are functional data structures that impart functionality when employed by processor(s) 702. As defined within this disclosure, a "data structure" is a physical implementation of a data model's organization of data within a physical memory. As such, a data structure is formed of specific electrical or magnetic structural elements in a memory. A data structure imposes physical organization on the data stored in the memory as used by an application program executed using a processor.

Computer 700 may include one or more Input/Output (I/O) interfaces 718 communicatively linked to bus 706. In one aspect, I/O interface(s) 718 may include hardware controllers that allow computer 700 to communicate with external devices 720 where external devices 720 allow a user to interact with computer 700. For example, in that case, external devices may include a keyboard, a mouse, and/or a display. In other cases, I/O interfaces 128 may include, but are not limited to, network cards, modems, network adapters, etc. that allow computer 700 to communicate with one or more other systems.

FIG. 7 is not intended to suggest any limitation as to the scope of use or functionality of the examples described herein. Computer 700 is an example of computer hardware (e.g., a system) that is capable of performing the various operations described within this disclosure. Computer 700 can be practiced as a standalone device, as a bare metal server, in a cluster, or in a distributed cloud computing environment. In a distributed cloud computing environment, tasks are performed by remote processing devices that are linked through a communications network. In a distributed cloud computing environment, program modules may be located in both local and remote computer system storage media including memory storage devices.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service. Other examples of cloud computing models are described in the National Institute of Standards and Technology (NIST) and, more particularly, the Information Technology Laboratory of NIST.

Computer 700 may be operational with numerous other general-purpose or special-purpose computing system environments or configurations. Examples of computing systems, environments, and/or configurations that may be suitable for use with computer 700 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the term "processor" means at least one circuit capable of carrying out instructions contained in program code. The circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one aspect, a method can include determining, using computer hardware, that a design unit of a circuit design specified in a hardware description language is a prime block, determining, using the computer hardware, an output vector corresponding to an output of the prime block, and replacing, using the computer hardware, contents of the prime block with an accelerated simulation model specified in a high level language. The accelerated simulation model can determine a value for the output of the prime block as a function of values of one or more inputs of the prime block using the output vector. The method can include elaborating, using the computer hardware, the circuit design and compiling, using the computer hardware, the circuit design into object code that is executable to simulate the circuit design.

The foregoing and other implementations can each optionally include one or more of the following features, alone or in combination. Some example implementations include all the following features in combination.

In another aspect, the design unit interacts with the circuit design only through the one or more inputs and the output of the design unit.

In another aspect, the design unit has a marking data structure indicating that the design unit is a prime block, wherein the marking data structure defines the one or more inputs, the output, and the output vector for the design unit.

In another aspect, the marking data structure is implemented as an attribute, a pragma, a parameter, or a generic.

In another aspect, the output vector is a one dimensional array of values for the output, wherein the value for the output is determined by indexing into the output vector based on the values of the one or more inputs.

In another aspect, the method can include executing the object code to simulate the circuit design.

In another aspect, a selected value of a selected input of the one or more inputs during simulation is an X. In that case, the method can include creating a first index by replacing the X with a value of 0, creating a second index by replacing the X with a value of 1, and determining a first value from the output vector using the first index and a second value from the output vector using the second index.

In another aspect, the method can include, in response to determining that the first value matches the second value, selecting the first value or the second value as the value for the output.

In another aspect, the method can include, in response to determining that the first value does not match the second value, selecting X as the value for the output.

In another aspect, the design unit includes at least one of a buffer circuit element, a look-up table circuit element, or a Boolean logic gate circuit element.

In another aspect, a method includes, during a simulation of a circuit design using computer hardware, determining values of inputs to an accelerated simulation model of a design unit of the circuit design, wherein the design unit is a prime block and, during the simulation, computing an index based on the values of the inputs. The method also can include, during the simulation, determining a value for an output of the accelerated simulation model by selecting the value from an output vector of the accelerated simulation model based on the index. The output vector can be implemented as a one dimensional array of values corresponding to the output of the accelerated simulation model.

In another aspect, a system having a processor is capable of initiating and/or performing the various operations described within this disclosure.

In another aspect, a computer program product includes one or more computer readable storage media, and program instructions collectively stored on the one or more computer readable storage media, wherein the program instructions are executable by computer hardware to initiate the various operations described within this disclosure.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   determining, using computer hardware, that a design unit of a circuit design specified in a hardware description language is a prime block;
   determining, using the computer hardware, an output vector corresponding to an output of the prime block;
   wherein the output of the prime block is dependent only on one or more inputs of the prime block and the prime block interacts with the circuit design only through the one or more inputs and the output;
   replacing, using the computer hardware, contents of the prime block with an accelerated simulation model specified in a high level language, wherein the accelerated simulation model determines a value for the output of the prime block as a function of values of the one or more inputs of the prime block using the output vector;
   elaborating, using the computer hardware, the circuit design; and
   compiling, using the computer hardware, the circuit design into object code that is executable to simulate the circuit design.

2. The method of claim 1, wherein the design unit has a marking data structure indicating that the design unit is a prime block, wherein the marking data structure defines the one or more inputs, the output, and the output vector for the design unit.

3. The method of claim 2, wherein the marking data structure is implemented as an attribute, a pragma, a parameter, or a generic.

4. The method of claim 1, wherein the output vector is a one dimensional array of values for the output, wherein the value for the output is determined by indexing into the output vector based on the values of the one or more inputs.

5. The method of claim 1, further comprising:
   executing the object code to simulate the circuit design.

6. The method of claim 5, wherein a selected value of a selected input of the one or more inputs during simulation is an X, the method further comprising:
   creating a first index by replacing the X with a value of 0;
   creating a second index by replacing the X with a value of 1; and determining a first value from the output vector using the first index and a second value from the output vector using the second index.

7. The method of claim 6, further comprising:
in response to determining that the first value matches the second value, selecting the first value or the second value as the value for the output.

8. The method of claim 6, further comprising:
in response to determining that the first value does not match the second value, selecting X as the value for the output.

9. The method of claim 1, wherein the design unit includes at least one of a buffer circuit element, a look-up table circuit element, or a Boolean logic gate circuit element.

10. A system, comprising:
a processor configured to initiate operations including:
determining that a design unit of a circuit design specified in a hardware description language is a prime block;
determining an output vector corresponding to an output of the prime block;
wherein the output of the prime block is dependent only on one or more inputs of the prime block and the prime block interacts with the circuit design only through the one or more inputs and the output;
replacing contents of the prime block with an accelerated simulation model specified in a high level language, wherein the accelerated simulation model determines a value for the output of the prime block as a function of values of the one or more inputs of the prime block using the output vector;
elaborating the circuit design; and
compiling the circuit design into object code that is executable to simulate the circuit design.

11. The system of claim 10, wherein the design unit has a marking data structure indicating that the design unit is a prime block, wherein the marking data structure defines the one or more inputs, the output, and the output vector for the design unit.

12. The system of claim 11, wherein the marking data structure is implemented as an attribute, a pragma, a parameter, or a generic.

13. The system of claim 10, wherein the output vector is a one dimensional array of values for the output, wherein the value for the output is determined by indexing into the output vector based on the values of the one or more inputs.

14. The system of claim 10, wherein the processor is configured to initiate operations further comprising:
executing the object code to simulate the circuit design.

15. The system of claim 14, wherein a selected value of a selected input of the one or more inputs during simulation is an X, and wherein the processor is configured to initiate operations further comprising:
creating a first index by replacing the X with a value of 0;
creating a second index by replacing the X with a value of 1; and
determining a first value from the output vector using the first index and a second value from the output vector using the second index.

16. The system of claim 15, wherein the processor is configured to initiate operations further comprising:
in response to determining that the first value matches the second value, selecting the first value or the second value as the value for the output.

17. The system of claim 15, wherein the processor is configured to initiate operations further comprising:
in response to determining that the first value does not match the second value, selecting X as the value for the output.

18. A method, comprising:
during a simulation of a circuit design using computer hardware, determining values of inputs to an accelerated simulation model of a design unit of the circuit design, wherein the design unit is a prime block;
wherein an output of the prime block is dependent only on one or more inputs of the prime block and the prime block interacts with the circuit design only through the one or more inputs and the output;
during the simulation, computing an index based on the values of the inputs; and
during the simulation, determining a value for an output of the accelerated simulation model by selecting a value from an output vector of the accelerated simulation model based on the index, wherein the output vector is a one dimensional array of values corresponding to the output of the accelerated simulation model.

* * * * *